(12) United States Patent
De Sandre et al.

(10) Patent No.: US 6,381,177 B1
(45) Date of Patent: Apr. 30, 2002

(54) METHOD FOR CONTROLLED SOFT PROGRAMMING OF NON-VOLATILE MEMORY CELLS, IN PARTICULAR OF THE FLASH EEPROM AND EPROM TYPE

(75) Inventors: Guido De Sandre, Brugherio; Marco Pasotti, S. Martino Siccomario; Pier Luigi Rolandi, Monleale, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/699,309

(22) Filed: Oct. 27, 2000

(30) Foreign Application Priority Data

Oct. 29, 1999 (IT) .......................................... TO99A0942

(51) Int. Cl.⁷ .............................................. G11C 16/00
(52) U.S. Cl. ............................. 365/185.19; 365/185.18; 365/185.27
(58) Field of Search ....................... 365/185.19, 185.18, 365/185.27, 189.01, 185.11, 185.14

(56) References Cited

U.S. PATENT DOCUMENTS

| | | | | |
|---|---|---|---|---|
| 5,485,423 A | * | 1/1996 | Tang et al. ............. | 365/185.19 |
| 5,491,657 A | * | 2/1996 | Haddad et al. ......... | 365/185.27 |
| 5,914,896 A | * | 6/1999 | Lee et al. ............... | 365/185.19 |
| 6,005,809 A | * | 12/1999 | Sung et al. ............. | 365/185.29 |
| 6,172,909 B1 | * | 1/2001 | Hadda et al. .......... | 365/185.19 |

* cited by examiner

Primary Examiner—Son T. Dinh
(74) Attorney, Agent, or Firm—Lisa K. Jorgenson; Robert Iannucci; Seed IP Law Group, PLLC

(57) ABSTRACT

A method for controlled soft programming of a plurality of non-volatile memory cells, having bulk terminals connected to one another and to a common bulk line. The method includes supplying at least one soft programming pulse to the plurality of memory cells for a time interval. In this step, a bulk voltage with a rising negative ramp is applied to the common bulk line for the time interval. By this means, the threshold voltage of the cells is increased by body effect, and initially only the most depleted cells are soft programmed, with a limited drain current. Subsequently, when the bulk voltage increases, the cells with a higher threshold voltage are also soft programmed, until all the cells have reached the required minimum threshold value.

20 Claims, 3 Drawing Sheets

METHOD FOR CONTROLLED SOFT PROGRAMMING OF NON-VOLATILE MEMORY CELLS, IN PARTICULAR OF THE FLASH EEPROM AND EPROM TYPE

TECHNICAL FIELD

The present invention relates to a controlled soft programming method for non-volatile memory cells, in particular of the flash EEPROM and EPROM type.

BACKGROUND OF THE INVENTION

As is known, in general, the erasing operation of flash cells takes place by means of Fowler-Nordheim tunneling, and is carried out in parallel on all the flash cells belonging to a single memory sector.

In this respect, FIG. 1 shows a sector 2 of a flash-type memory 1, formed by a plurality of cells 3 which are disposed on lines and columns, and are connected to respective word lines 4 and bit lines 5.

In detail, the cells 3 which are disposed on a single line have gate terminals which are connected to a single word line 4, in turn connected to a line decoder 8; the cells 3 which are disposed on a single column have drain terminals which are connected to a single bit line 5, in turn connected to a column decoder 9. All the source terminals of the cells 3 are connected to one another, and are available outside the sector 2 via a common source line 6, and all the bulk terminals of the cells 3 are connected to one another, and are available outside the sector 2 via a common bulk line 7.

The line decoder 8 and the column decoder 9 address in a known manner the word lines 4 and the bit lines 5 which are connected to them.

With reference to FIG. 2 and to the wiring diagram shown in FIG. 1, the erasing operation of the sector 2 by Fowler-Nordheim tunneling takes place by supplying one or more erasing pulses to the cells 3. More specifically, for a pre-determined time, which is equivalent to 10–40 ms, a voltage $V_B$ which increases in a non-linear manner is supplied to the common bulk line 7, starting from a minimum potential which is equivalent to 0V, up to a maximum potential which is equivalent to 8V (FIG. 2).

Simultaneously, all the word lines 4 are biased to a negative voltage (–2V) by means of the line decoder 8, whereas all the bit lines 5 and the common source line 6 are left floating.

By this means, below the floating gate regions 15 of the cells 3, there is created a transverse electrical field, having an intensity such as to permit extraction of the electrons which have remained trapped in this floating gate region 15, after a preceding programming operation. The threshold voltage of the cells 3 is consequently lowered to a first pre-determined threshold value.

One of the problems which is encountered most frequently in erasing of memory cells is that after the erasing pulses have been applied, some memory cells are erased excessively, until a threshold voltage which is too low, or even negative, is obtained. These cells are thus in a conductive state, although their respective word lines are biased to ground (depleted cells).

It is known that in a non-volatile memory having a NOR configuration, the presence of depleted cells can distort the subsequent reading operation of the memory itself. In memories of this type, it is therefore necessary to have the erasing operation followed by a soft programming operation of the depleted cells.

This soft programming operation consists of biasing a pre-selected group, or, as an alternative, all the cells belonging to a memory sector previously erased, such as to produce in the cells an increase in the threshold voltage, to above a second predetermined threshold value. In greater detail, within the floating gate region of the cells belonging to the pre-selected group or to the memory sector erased, there is generated a flow of hot electrons, with an intensity and duration such as to increase the threshold voltage of the cells such that depleted cells are no longer present.

For this purpose, according to patent U.S. Pat. No. 5,546,340, one or more soft programming pulses are supplied to a pre-selected group of cells (hereinafter defined as pre-selected cells), belonging to the memory sector previously erased, or to all the cells in the sector. More specifically, for a pre-determined time of a few microseconds, the word lines which are connected to the gate terminals of the pre-selected cells are biased to a constant positive potential. This potential is such as to guarantee that none of the preselected cells reaches a threshold voltage which is higher than a pre-determined maximum threshold value.

Simultaneously, a constant positive potential is applied to the bit lines which are connected to the drain terminals of the pre-selected cells.

On the other hand, the common source line and the common bulk line are connected respectively to ground and to a pre-determined constant negative potential.

However, this known solution has the disadvantage that during the step of soft programming of the memory cells, the drain current of these cells has somewhat high values. In particular, when the soft programming is started, the drain current has a very high peak, owing to the fact that the overdrive voltage of the cells to be programmed (which is defined as the difference between the gate-source voltage and the threshold voltage) is somewhat high, owing to the initial low value of the threshold voltage.

In order to eliminate this disadvantage, according to patent EP-A-0 908 895, there is applied to the word lines which are connected to the pre-selected cells a ramp voltage rising linearly, from a minimum potential to a maximum potential.

Although it is advantageous in various respects, this known solution has the disadvantage that, for initial values of the ramp voltage, the transverse electrical field which is created below the floating gate region of the pre-selected cells is limited. Consequently, there is a low level of efficiency in the injection of hot electrons into the floating gate region, and therefore a low level of efficiency of soft programming.

SUMMARY OF THE INVENTION

The technical problem on which the present invention is based consists of eliminating the limitations and disadvantages previously described.

According to one aspect of the present invention, there is provided a method for controlled soft programming of non-volatile memory cells, where each cell has a control gate terminal and a bulk terminal, the bulk terminal of each cell connected to the bulk terminal of each other cell and to a common bulk line. According to one aspect of the invention, the method includes applying a voltage with a linearly rising negative ramp to the bulk terminals of the cells, and simultaneously supplying one or more soft programming pulses to the control gate terminal of the cells during a predetermined time interval.

According to another aspect of the invention, the soft programming of the cells is alternatively applied to a pre-determined subset of the cells.

According to still another aspect of the invention, the cells to be soft programmed are soft programmed as a function of the rising bulk voltage level. Preferably, soft programming the subset of cells as a function of the rising bulk voltage level includes applying an initial negative bulk voltage to the cells to be soft programmed and subsequently gradually increasing the bulk voltage to a maximum value, whereby the cells in the subset of cells are soft programmed as a function of the level of depletion in the cells.

According to yet other aspects of the invention, the invention includes a non-volatile memory device having a multiple memory cells, each cell having a bulk terminal connected to the bulk terminal of each other cell and to a common bulk line. The non-volatile memory device of the invention also includes a bulk biasing unit connected to the common bulk line, the bulk biasing unit including a voltage generator with a rising negative ramp. The rising negative ramp further defining either a square wave or a ramp rising substantially linearly from a negative value.

BRIEF DESCRIPTION OF THE DRAWINGS

The characteristics and advantages of the method according to the invention will become apparent from the following description of an embodiment, provided indicatively by way of non-limiting example, with reference to the attached drawings, in which.

DETAILED DESCRIPTION OF THE INVENTION

Figure 1:
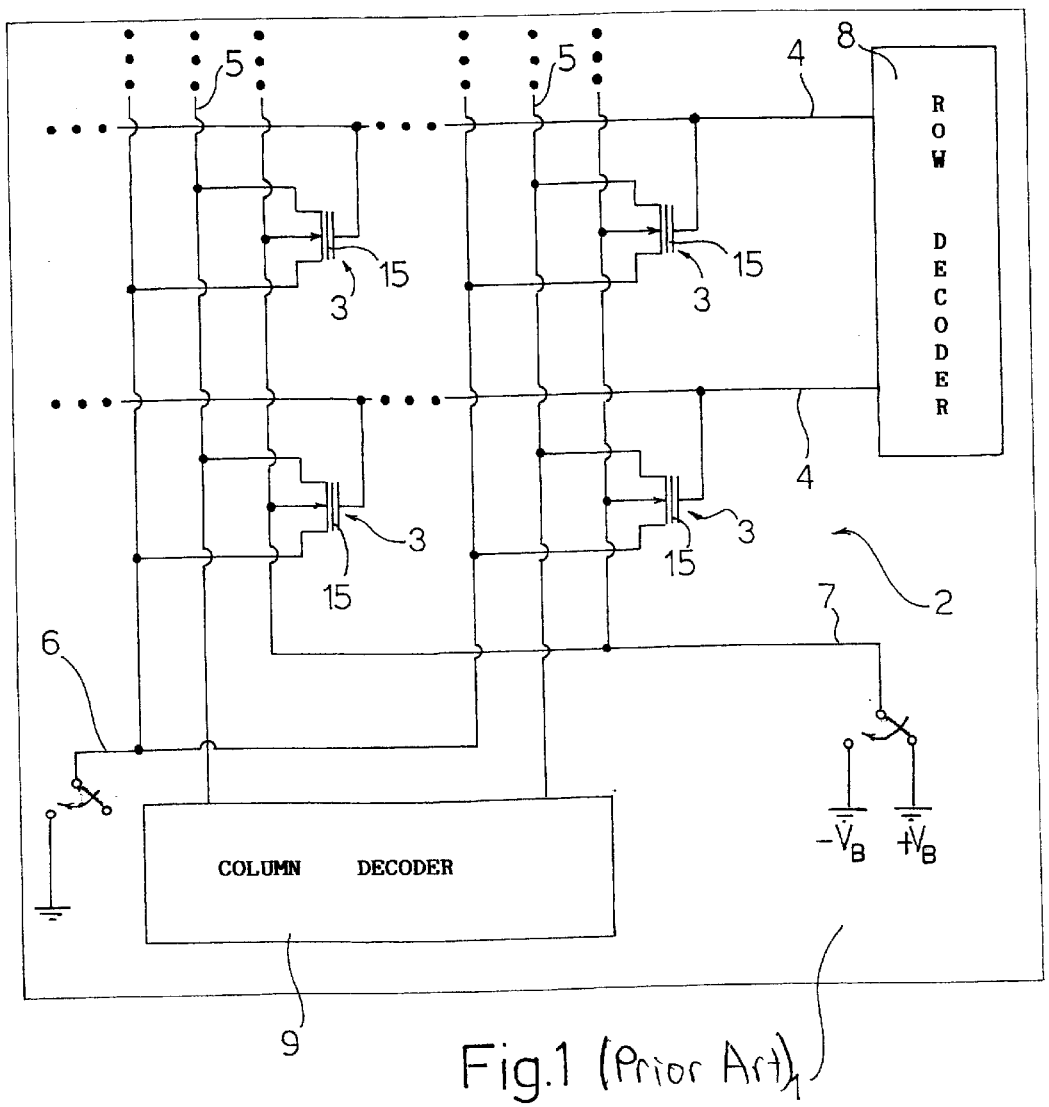
FIG. 1 shows a simplified wiring diagram of a known, non-volatile memory.
Figure 2:
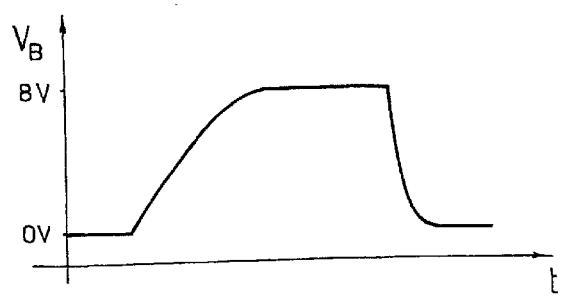
FIG. 2 shows the development of an electrical value used during the step of erasing the memory in FIG. 1.
Figure 3:
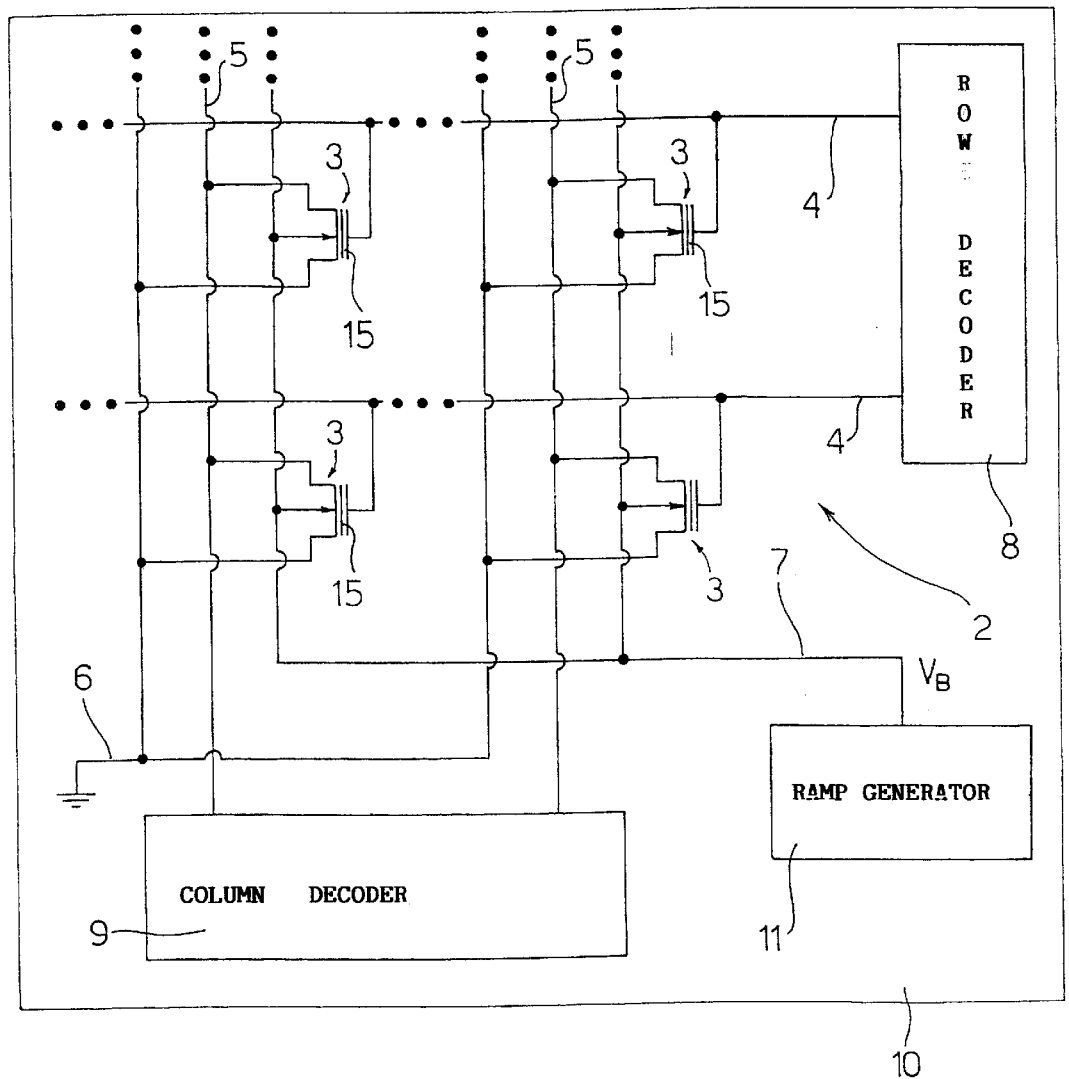
FIG. 3 shows a simplified wiring diagram of a non-volatile memory according to the invention.
Figure 4A:
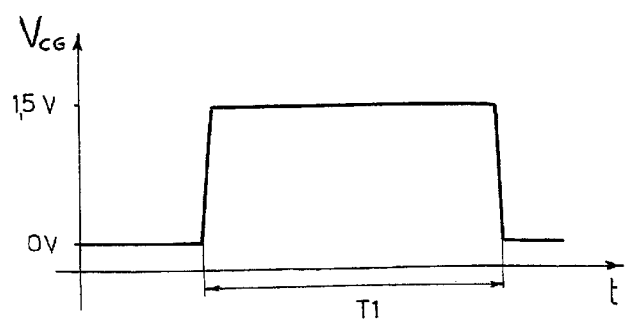
FIGS. 4a, 4b, 4c and 4d show the development of electrical values used in order to implement the method for soft programming according to the invention, of the memory in FIG. 3.
Figure 4B:
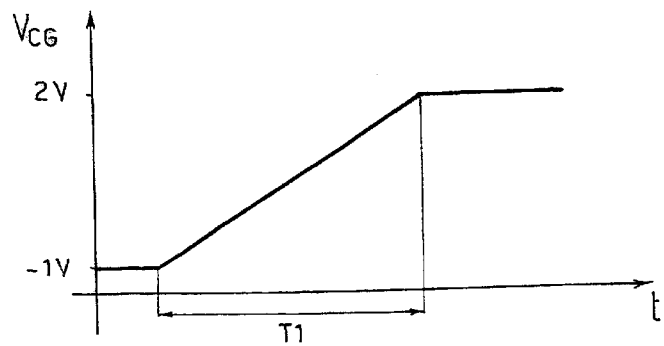
Figure 4C:
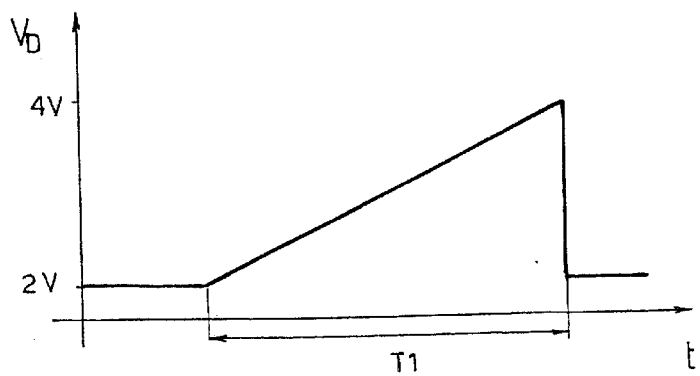
Figure 4D:
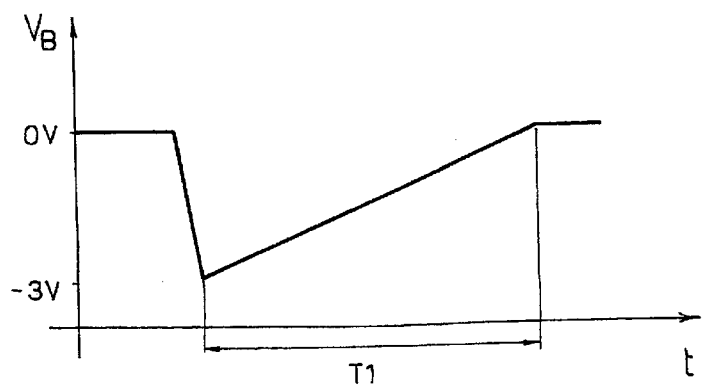

The method for soft programming according to the invention is applied to a memory 10, which is shown in FIG. 3, and is similar to the memory 1 in FIG. 1, except for the presence of a negative ramp voltage generator 11, which is connected to the common bulk line 7, for the reasons explained hereinafter.

With reference to FIGS. 4a, 4b, 4c and 4d, the method for soft programming according to the invention consists of applying a negative voltage with a rising ramp to the bulk region, and simultaneously supplying one or more soft programming pulses to the control gate terminal of the cells to be soft programmned.

In detail, the cells 3 to be soft programmed (which hereinafter are defined as pre-selected cells) can be disposed along adjacent word lines 4; as an alternative, the cells 3 to be soft programmed can constitute the entire sector 2, provided that the current which is necessary in order to program them is sufficient. Thus, for a pre-determined time T1, which for example is equivalent to 200–400 μs, via the line decoder 8, there is supplied to the word lines 4 which are connected to the gate terminals of the pre-selected cells 3, a gate voltage $V_{CG}$ defining a rectangular pulse, with an amplitude which, for example, is equivalent to approximately 1.5 V (FIG. 4a), such as to ensure that none of the pre-selected cells 3 reaches a threshold voltage which is higher than a pre-determined maximum threshold value.

As an alternative (FIG. 4b), there is supplied to the word lines 4 which are connected to the gate terminals of the pre-selected cells 3, a gate voltage $V_{CG}$ taking the form of a ramp rising linearly from a negative value, for example which is equivalent to approximately −1V, to a positive value, which for example is equivalent to approximately 2–3V.

Simultaneously, via the column decoder 9, a positive potential, which for example is equivalent to approximately 4.5 V, is applied to all the bit lines 5 which are connected to the drain terminals of the pre-selected cells 3.

As an alternative (FIG. 4c), there is supplied to the bit lines 5 a drain voltage $V_D$ in the form of a ramp increasing linearly from a minimum value, which for example is equivalent to approximately 2V, to a maximum value, which for example is equivalent to approximately 4V.

On the other hand, the common source line 6 is biased to ground (0V), whereas the common bulk line 7 is supplied with a bulk voltage $V_B$ (FIG. 4d), which is in the form of a ramp increasing linearly from a minimum value, which for example is equivalent to approximately −3V, to a maximum value, which for example is equivalent to approximately 0V.

By applying initially a negative bulk voltage $V_B$, an increase in the threshold voltage of the pre-selected cells 3 is obtained by body effect, thus leaving depleted only the cells having very low threshold voltages. This makes it possible to start to soft program only the most depleted pre-selected cells 3, thus avoiding the initial peak of the drain current $I_D$. Then, by increasing gradually the bulk voltage $V_B$, the depleted pre-selected cells 3 are also soft programmed, but with a threshold voltage which is lower (in absolute terms) than the preceding voltages. On completion, when the bulk voltage $V_B$ has reached the maximum value, all the pre-selected cells 3 are soft programmed, nevertheless with elimination of the initial current peak.

At the same time, by biasing negatively the common bulk line 7, and simultaneously by biasing positively the word lines 4 and the bit lines 5 of the pre-selected cells 3, it is possible to increase the transverse electric field which is present below the floating gate region 15. By this means the pre-selected cells 3 are soft programmed, but more efficiently than in the solution known according to patent EP-A-0 908 895.

In addition, use of the voltage with a ramp $V_D$ at the drain terminal of the pre-selected cells 3 makes it possible to solve problems which are associated with the use of technologies requiring somewhat low breakdown voltages of the drain-bulk junction of the pre-selected cells 3, for example of approximately 5V. In fact, by supplying the drain voltage $V_D$ to the bit lines 5 which are connected to the pre-selected cells 3, and simultaneously by supplying the bulk voltage $V_B$ to the common bulk line 7, it is ensured that at all times, the inverse voltage drop at the drain-bulk junction of the pre-selected cells 3 is never greater, in absolute terms, than the breakdown voltage, even in the case of the above-described technologies.

Finally, it is apparent that many modifications and variants can be made to the soft programming method described and illustrated, all of which come within the scope of the inventive concept, as defined in the attached claims.

For example, although the method for soft programming according to the invention uses drain voltages $V_D$ and bulk voltages $V_B$ of the continuous ramp type, it is also possible to use ramps of the discrete type (with steps with an amplitude which, for example, is equivalent to 40–100 mV).

In another example, according to one alternative embodiment, a gate voltage $V_{CG}$ is supplied to the word lines 4, which are connected to the gate terminals of the pre-selected cells 3. The gate voltage $V_{CG}$ takes the form of a ramp decreasing linearly from a maximum value, which for example is equivalent to approximately 4.5 volts, down to a minimum value, which for example is equivalent to approximately 1.5 volts. Simultaneously, a positive potential, which for example is equivalent to approximately 5 volts, is applied to all the bit lines 5 which are connected to the drain terminally of the pre-selected cells 3. The common source line 6 is supplied with a source voltage $V_S$ which is in the form of a ramp decreasing linearly from a maximum value, which for example is equivalent to approximately 3 volts, down to a minimum value, which is for example equivalent to approximately 0 volts, while the common bulk line 7 is biased to ground.

In addition, the memory cells can be either of the two-level type (and store a single bit), or of the multiple-level type (and store several bits).

In addition, although the invention has been described with particular reference to the case of memory cells of the flash EEPROM type, it can also be applied to the case of memory cells of the EPROM type.

We claim:

1. Method for controlled soft programming of a plurality of non-volatile memory cells having bulk terminals connected to one another and to a common bulk line, the method comprising: applying a bulk voltage with a rising negative ramp to the said common bulk line.

2. Method according to claim 1, wherein said bulk voltage is a ramp of the continuous type.

3. Method according to claim 1, wherein said bulk voltage a ramp of the discrete type.

4. Method according to claim 1, wherein said bulk voltage increases from a minimum value of between −5V and −2V, to a maximum value of between −2V and 0V.

5. Method according to claim 4, wherein the plurality of memory cells further comprise drain terminals which are connected to bit lines, and the method further comprises the applying a drain voltage to said bit lines.

6. Method according to claim 5, wherein said drain voltage is a voltage with a positive ramp, rising between a minimum value of between 1V and 3V, and a maximum value of between 3V and 5V.

7. Method according to claim 6, wherein said drain voltage is a voltage with a ramp of the continuous type.

8. Method according to claim 6, wherein said drain voltage is a voltage with a ramp of the discrete type.

9. Method according to claim 5, wherein said drain voltage is a constant voltage.

10. Method according to claim 1, wherein said plurality of non-volatile memory cells are disposed along adjacent word lines, and wherein said step of applying a voltage with a rising negative ramp to each of the memory cells further comprises applying a gate voltage to each said word line.

11. Method according to claim 10, wherein said step of applying a gate voltage to each said word line further comprises applying said gate voltage over a predetermined time period, and wherein said gate voltage further comprises one of a rectangular pulse and a linearly rising ramp pulse.

12. Non-volatile memory device comprising: a plurality of memory cells having bulk terminals connected to one another and to a common bulk line, and a bulk biasing unit connected to the common bulk line, the bulk biasing unit comprising a voltage generator with a rising negative ramp.

13. The non-volatile memory device according to claim 12, wherein the rising negative ramp further defines one of a square wave and a ramp rising substantially linearly from a negative value.

14. A method for soft programming a plurality of non-volatile memory cells each having a control gate terminal and a bulk terminal connected to each of the bulk terminals of each other non-volatile memory cell and to a common bulk line, the method comprising:

applying a voltage with a linearly rising ramp to the bulk terminals of the cells;

and simultaneously supplying one or more soft programming pulses to the control gate terminal of the cells.

15. The method according to claim 14, wherein the simultaneously supplying one or more soft programming pulses further comprises supplying the one or more soft programming pulses during a predetermined time interval.

16. The method according to claim 15, wherein the rising ramp bulk voltage further comprises a rising negative ramp bulk voltage.

17. The method according to claim 16, further comprising selecting a subset of the plurality of cells to be soft programmed.

18. The method according to claim 17, further comprising soft programming the subset of cells as a function of the rising bulk voltage level.

19. The method according to claim 18, wherein the soft programming the subset of cells as a function of the rising bulk voltage level further comprises applying an initial negative bulk voltage to the subset of cells and subsequently gradually increasing the bulk voltage to a maximum value, whereby the cells in the subset of cells are soft programmed as a function of depletion level.

20. The method according to claim 19, further comprising simultaneously biasing positively word lines and bit lines interconnecting the selected subset of cells.

\* \* \* \* \*